(12) United States Patent
Samuelson et al.

(10) Patent No.: US 8,212,237 B2
(45) Date of Patent: Jul. 3, 2012

(54) NANOSTRUCTURED MEMORY DEVICE

(75) Inventors: Lars Samuelson, Malmö (SE); Claes Thelander, Lund (SE); Jonas Ohlsson, Malmö (SE); Anders Mikkelsen, Arlöv (SE)

(73) Assignee: QuNano AB, Lund (SE)

( * ) Notice: Subject to any disclaimer, the term of this patent is extended or adjusted under 35 U.S.C. 154(b) by 0 days.

(21) Appl. No.: 13/003,046

(22) PCT Filed: Jul. 2, 2009

(86) PCT No.: PCT/SE2009/050857
§ 371 (c)(1),
(2), (4) Date: Jan. 7, 2011

(87) PCT Pub. No.: WO2010/005380
PCT Pub. Date: Jan. 14, 2010

(65) Prior Publication Data
US 2011/0140086 A1   Jun. 16, 2011

(30) Foreign Application Priority Data
Jul. 9, 2008   (SE) ...................... 0801648

(51) Int. Cl.
*H01L 31/00* (2006.01)
(52) U.S. Cl. .................. 257/24; 257/E29.245; 977/938; 438/264
(58) Field of Classification Search ............... 257/24, 257/E29.245; 438/264
See application file for complete search history.

(56) References Cited

U.S. PATENT DOCUMENTS

| | | | |
|---|---|---|---|
| 6,881,994 B2 | 4/2005 | Lee et al. | |
| 7,129,538 B2 | 10/2006 | Lee et al. | |
| 7,335,908 B2 | 2/2008 | Samuelson et al. | |
| 2004/0031975 A1 | 2/2004 | Kern et al. | |
| 2006/0244361 A1 | 11/2006 | Kim et al. | |
| 2007/0014151 A1 | 1/2007 | Zhang et al. | |
| 2008/0031034 A1 | 2/2008 | Jalabert | |
| 2010/0276667 A1* | 11/2010 | Kim et al. ................ | 257/24 |

FOREIGN PATENT DOCUMENTS
EP    1420414 A1    5/2004
WO    2007/104781 A3   9/2007

OTHER PUBLICATIONS

International Searching Authority—Swedish Patent Office (ISA/SE). International Search Report, Intl. Application PCT/SE09/50857. Oct. 26, 2009.

\* cited by examiner

*Primary Examiner* — Marcos D. Pizarro
*Assistant Examiner* — Eva Yan Montalvo
(74) *Attorney, Agent, or Firm* — The Marbury Law Group, PLLC

(57) ABSTRACT

The present invention provides a nanostructured memory device comprising at least one semiconductor nanowire (3) forming a current transport channel, one or more shell layers (4) arranged around at least a portion of the nanowire (3), and nano-sized charge trapping centers (10) embedded in said one or more shell layers (4), and one or more gate electrodes (14) arranged around at least a respective portion of said one or more shell layers (4). Preferably said one or more shell layers (4) are made of a wide band gap material or an insulator. The charge trapping centers (10) may be charged/written by using said one or more gate electrodes (14) and a change in an amount of charge stored in one or more of the charge trapping centers (10) alters the conductivity of the nanowire (3).

17 Claims, 4 Drawing Sheets

NANOSTRUCTURED MEMORY DEVICE

CROSS-REFERENCE TO OTHER APPLICATIONS

This application is a national phase application under 35 U.S.C. §371 of international application PCT/SE2009/050857 (filed Jul. 2, 2009) which claims priority to Swedish Application 0801648-7 (filed Jul. 9, 2008).

TECHNICAL FIELD OF THE INVENTION

The present invention relates to memory devices and in particular semiconductor memory devices comprising nanowires as structural elements.

BACKGROUND OF THE INVENTION

Semiconductor devices have, until recently, been based on planar technology, which imposes constraint in terms of miniaturization. The development of nanotechnology and, in particular, the ability to produce nanowires has opened up new possibilities for designing semiconductor devices having improved properties and making novel devices which were not possible with planar technology.

The interest in memory circuits for the data storage applications has over the last couple of years shown a significant increase. The interest is arising primarily from the seemingly ever increasing demand for faster and more densely packed memories in combination with recent reports indicating that memory circuits based on nanotechnology are technologically achievable. Compared to the today most used non-volatile memories for handheld devices, flash memories, memory devices based on nanotechnology, such as single-electron devices, have the potential of offering extremely dense memories due to the nanoscale dimensions. Another advantage is very low power consumption due to the fact that only a very limited number of electrons are involved in the basic operations, which also can give very fast operation. The size of memory devices based on planar technology can not readily be reduced without various problems, such as increased contact resistance due to reduced size of contacts or poor current control due to reduced channel width.

European patent application EP 1 420 414 A1 discloses one example of a memory device based on nanotechnology with a footprint in the range of the smallest planar memory devices. This memory device includes a nanotube grown on a substrate such that one end of the nanotube is in contact with a source region of the substrate and the opposite end is in contact with a drain region whereby the nanotube forms an electron transport channel of the memory device. A memory cell that comprises an electron storing layer sandwiched between insulation layers is formed around the nanotube. The electron storage layer is either a homogenous layer or a porous layer containing nanodots filled with an electron storage material using chemical vapor deposition or sputtering. The flow of electrons through the nanotubes is controlled by a control gate formed around the memory cell.

SUMMARY OF THE INVENTION

The prior art has drawbacks with regards to being able to combine speed, low volatility and small footprint in memory devices.

The object of the present invention is to overcome the drawbacks of the prior art. This is achieved by the nanostructured memory device as defined in the independent claim.

The nanostructured memory device according to the invention comprises at least one semiconductor nanowire forming a current transport channel, one or more shell layers with embedded charge storage centres arranged around at least a portion of the nanowire, and at least a first gate electrode arranged around at least a portion of said one or more shell layers. The amount of charge stored in the charge trapping centres is controlled by the gate electrode, i.e. the charge trapping centres are written/erased by applying a predetermined voltage to the gate electrode. Any change in the amount of charge stored in one or more of the charge trapping centres alters the conductivity of the nanowire. Preferably the charge trapping centres are embedded in a wide-bandgap material or an insulator.

In one embodiment of the present invention the charge trapping centres are semiconductor nano crystals, preferably grown by epitaxy.

In another embodiment the nanostructured memory device comprises a plurality of gate electrodes, each arranged around a respective portion of the nanowire (3), whereupon the resistance of the nanowire 3 can be increased/decreased step by step depending on the number of gate electrodes that are activated.

In yet another embodiment of a nanostructured memory device according to the present invention said one or more shell layers are made of materials having different band gap in order to give a graded or crested band profile. In one embodiment the graded or crested band profile provides a barrier structure between the charge trapping centres and the nanowire and/or between the charge trapping centres and the gate electrode such that charging of the charge trapping centres is facilitated for predetermined biasing conditions.

Thanks to the invention it is possible to provide a memory device having a high write speed and a low volatility.

It is an advantage of the invention to provide a memory device having a reduced footprint as compared to conventional devices.

It is a further advantage of the invention to provide possibilities for vertical stacking of multi gate memory devices and to further increase the packing density of memory devices.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein FIG. 1 schematically illustrates a memory device according to one embodiment of the present invention and a close-up of the active region, FIG. 2 schematically illustrates a memory device comprising three shell layers according to the present invention and a close-up of the active region.

DETAILED DESCRIPTION OF EMBODIMENTS

Basically, the present invention is based on using gated nano-sized charge trapping centres arranged around a semiconductor nanowire to control the conductivity of the nanowire.

Figure 1:
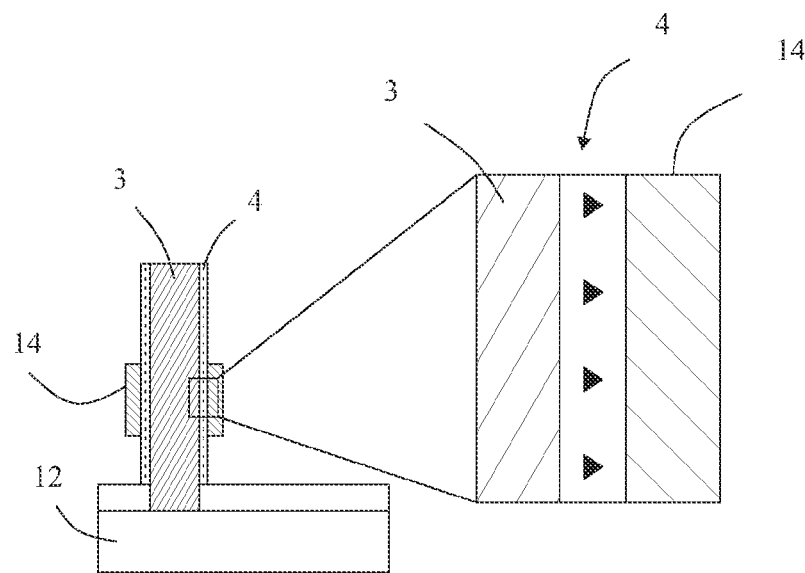

Referring to FIG. 1, a nanostructured memory device according to the present invention comprises at least one semiconductor nanowire 3 forming a current transport channel of the memory device. Preferably the nanowire 3 is protruding from a substrate. One or more shell layers are arranged around at least a portion of the nanowire 3. Nano-sized charge trapping centres 10 are embedded in, and separated from the nanowire core, by said one or more shell layers. These nano-sized charge trapping centres, which may be in the form of nano crystals, can be charged positively or negatively, thereby affecting the conductivity of the nanowire core. Hence a change in an amount of charge stored in one or more of the charge trapping centres 10 alters the conductivity of the nanowire 3. The amount of charge stored in the charge trapping centres 10 is controlled by at least a first gate electrode arranged around at least a portion of said one or more shell layers 4. The nanowire 3 can be made of a semiconductor material that is either n- or p-type, and charges in the trapping centres can either increase or reduce the resistance of the nanowire, depending on operation of the device.

The basic process of nanowire formation on substrates is by particle assisted growth or the so-called VLS (vapour-liquid-solid) mechanism described in U.S. Pat. No. 7,335, 908, as well as different types of Chemical Beam Epitaxy and Vapour Phase Epitaxy methods. However, as shown in the international application No. WO 2007/104781 nanowires may also be grown without the use of a particle as a catalyst. From this it follows that the nanowires preferably are epitaxially grown from the substrate 12, i.e. the nanowires 3 are preferably in epitaxial contact with the substrate 12. The radial structure of the nanostructured memory device may be accomplished by a first growth of nanowires in a first growth mode promoting nanowire growth and a second selective growth of one or more shell layers 4 in a second growth mode promoting radial growth. Thus shell layers that are in epitaxial contact with the nanowire 3 and optionally with adjacent shell layers can be formed. Hence the radial structure comprising the nanowire and the surrounding one or more shell layers may be regarded as a nanowire itself with a nanowire core and one or more radial layers.

Nanowires are usually interpreted as nanostructures that are of nanometre dimension in its diameter. As the term nanowire implies, it is the lateral size that is on the nanoscale whereas the longitudinal size is unconstrained. Such nanostructures are commonly also referred to as nanowhiskers, one-dimensional nanoelements, nanorods, etc. Although these terms imply an elongated shape the nanowires may be pyramidal or stub-like and since nanowires may have various cross-sectional shapes the diameter is in this application intended to refer to the effective diameter. Generally, nanowires are considered to have at least two dimensions each of which are not greater than 300 nm, but nanowires can have a diameter or width of up to about 1 µm while preserving at least some of the unique properties. The one dimensional nature of the nanowires provides unique physical, optical and electronic properties. These properties can for example be used to form devices utilizing quantum mechanical effects or to form heterostructures of compositionally different materials that usually cannot be combined due to large lattice mismatch. One example is integration of semiconductor materials with reduced lattice-matching constraints, which for example allow the growth of III-V semiconductor nanowires on Si substrates.

In one embodiment of the present invention said one or more shell layers 4 that embeds the nano-sized charge trapping centres are made of wide bandgap materials or an insulator to facilitate charge transfer for biasing conditions corresponding to writing/erasing of the nanostructured memory device.

A charge can be transferred to the nano-sized charge trapping centres 10 by applying a voltage to the gate electrode 14. Depending on the position of the nano-sized charge trapping centres 10 and the properties of the material surrounding the charge trapping centres 10, the charge is transferred either from the gate electrode 14 or from the nanowire 3.

Figure 2:
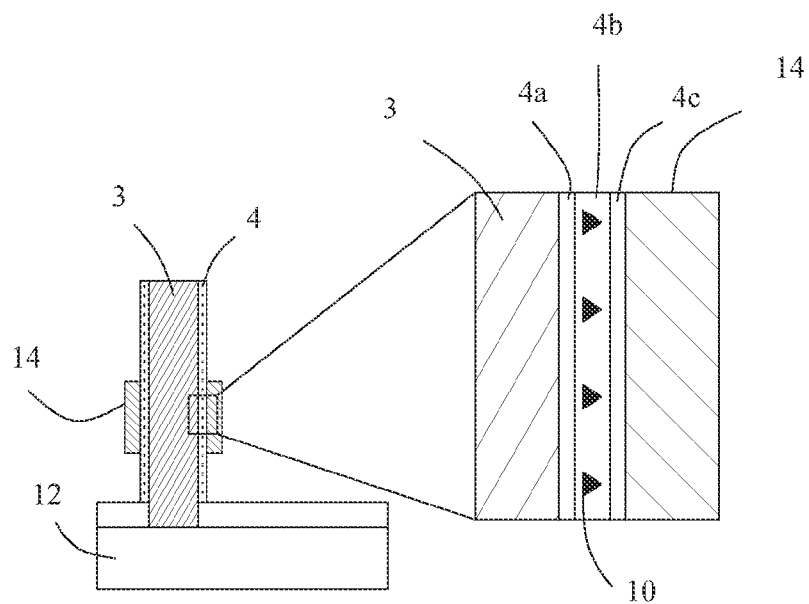

Referring to FIG. 2, in another embodiment of the present invention the memory device comprises a nanowire 1 at least partly surrounded by a first shell layer 4a, a second shell layer 4b and a third shell layer 4c, wherein the second shell layer 4b embeds charge trapping centres 10, the first shell layer 4a separates the charge trapping centres 10 from the nanowire 3, and the third shell layer 4c separates the charge trapping centres 10 from a gate electrode 14 arranged around the third shell layer 4c.

Figure 3:
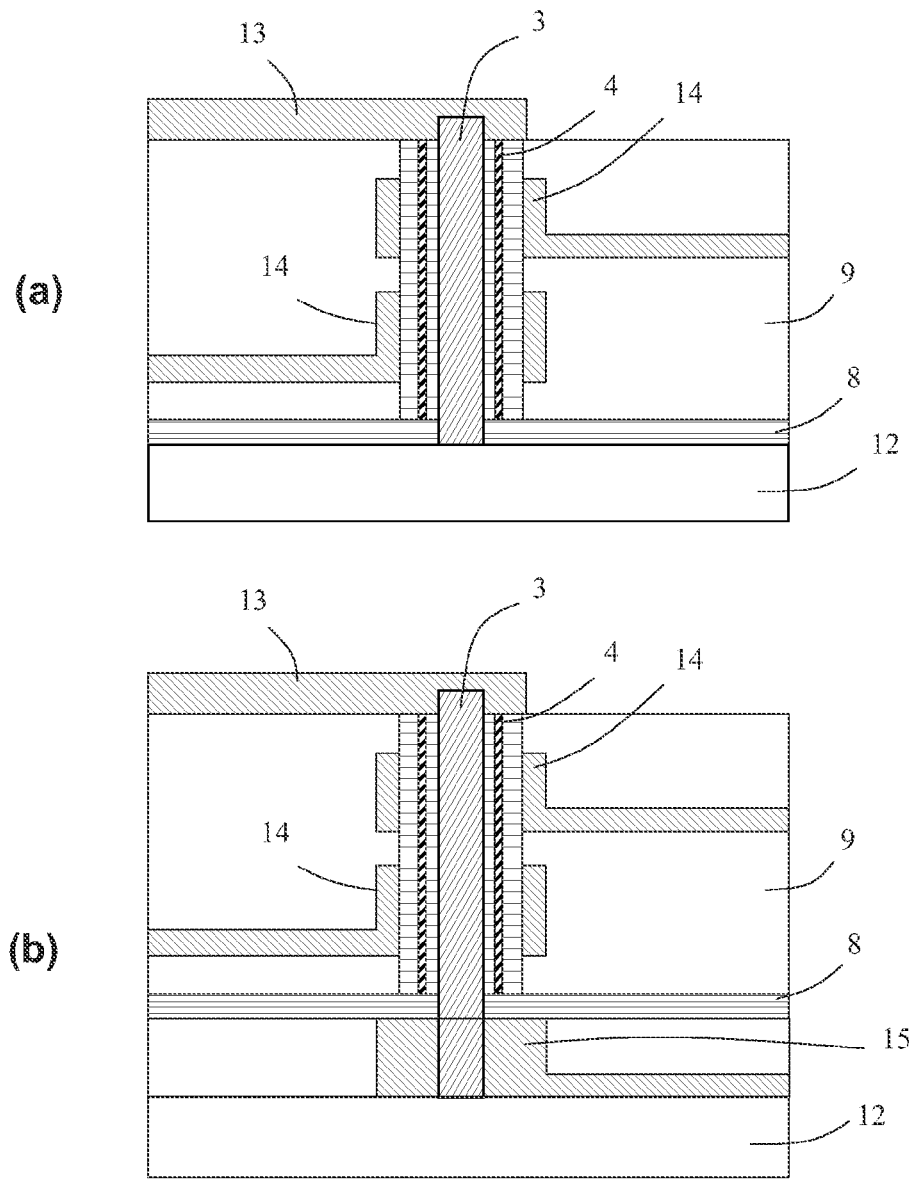
FIGS. 3a-b schematically illustrate another embodiment of the present invention comprising a plurality of gate electrodes arranged around the nanowire, FIGS. 4a-b schematically illustrate the current in the nanowire in (a) depletion mode and (b) enhancement mode, and FIGS. 5a-c schematically illustrate writing/charging of a memory device according to the present invention.

FIGS. 3a-b schematically illustrate a memory device according to one embodiment of the present invention that comprises a plurality of gate electrodes 14, each arranged around a respective portion of the nanowire 3 in order to transfer charges into/out from the charge trapping centres 10 by field-assisted tunneling. Charge trapping centres 10 under each gate electrode 14 can be charged separately, whereupon the resistance of the nanowire 3 can be increased/decreased step by step depending on the number of gate electrodes that are activated.

In another embodiment of the present invention the writing of the charge trapping centres 10 are carried out by hot charge carrier injection from the hot nanowire 3. This thermally assisted transfer (tunneling) of charges into/out from the charge trapping centres 10 can be performed at a lower wrap-gate voltage than required for the above-mentioned field-assisted tunneling.

The one or more shell layers 4 in which the charge trapping centres 10 are embedded may comprise of one or more materials in such a way that the energy band-profile of said shell layers 4 embedding the charge trapping centres 10 is graded or crested. In one embodiment, the shell layers that separate the charge trapping centres from the nanowire 3 and/or the gate electrode 14 have a sloped or step by step changing band-profile, which provides a barrier structure between the charge trapping centres and the nanowire and/or between the charge trapping centres and the gate electrode, to facilitate charge transfer for certain biasing conditions. The grading/cresting can be one-sided in order to increase write-speed from or to the charge trapping centres 10 or two-sided in order to increase write-speed from and to the charge trapping centres 10. In the unbiased condition the trapped charges will experience the full width of the barrier structure, which is important to the non-volatility of the memory, whereas upon biasing (writing/erasing) the effective tunnel width is considerable reduced. Hence, the memory device according to the present invention combines a low volatility and a high write speed.

The charge trapping centres 10 are preferably semiconductor nano crystals, such as InAs, grown by epitaxy. The epitaxy facilitates proper design of the band-profile in order to accomplish the desired writing/erasing and volatility properties. However, charge trapping centres may also be metal nanoparticles deposited from a liquid, gas or vacuum, or a deposited thin film, such as $Si_3N_4$ or oxides such as $HfO_2$, with many charge-traps. The specific materials are given by way of example only and not limited to these.

In one embodiment the nanostructured memory device comprises a top and a bottom contacts connecting to the opposite end portions of the nanowire 3. In prior art memory devices of this kind these contacts are typically referred to as source and drain contacts, respectively. The bottom contact may for example be in a wrap around configuration at the base of the nanowire or connecting to the base of the nanowire through a buffer layer and/or through the substrate 12.

The amount of charge stored in the charge trapping centres 10 may be defined by a plurality of discrete charge levels, thereby increasing the amount of information stored per gate electrode 14. This is accomplished by having charge trapping centres wherein charge is transferred at different biasing conditions. For example the charge trapping centres (10) under each gate electrode (14) may be adapted to be charged in groups or separately, whereupon the resistance of the nanowire 3 increases/decreases step by step depending on the number of charge trapping centres 10 that are charged by the gate electrodes 14.

On embodiment of a memory device according to the present invention comprises a group of nanowires electrically connected in parallel but individually gated by one or more gate electrodes 14 arranged along each nanowire 3, whereby each nanowire 3 of the group of nanowires contributes to one or more level(s) of a read current.

FIGS. 3a-b schematically illustrate one embodiment of a nanostructured memory device according to the present invention comprising a nanowire 3 and one or more shell layers 4 at least partly enclosing the nanowire 3. Said one or more shell layers are made of a wide bandgap material or an insulator and charge trapping centres 10, by way of example in the form of nano-crystals, are embedded in said one or more shell layers 4. A plurality of gate electrodes are arranged around respective portions of said one or more shell layers 4. The nanowire 3 and the gate electrodes 14 may be enclosed by an insulator 9. Preferably a top contact 13 is arranged on one end portion of the nanowire 3 opposite the substrate 12. As illustrated in FIG. 2a the other end portion of the nanowire is connected to a bottom contact via the substrate and/or or a so called buffer layer (not shown). In order to separate the substrate from the shell layers 4 the nanostructured memory device may comprise a layer 8 of a wide bandgap material or an insulator that covers the substrate 12 and encloses said other end portion of the nanowire 3. FIG. 3b schematically illustrates another embodiment wherein said other end portion of the nanowire 1 is connected via an electrode 15 in a wrap around configuration to a bottom contact. The substrate 12 may in this embodiment be an insulator.

Figure 4:
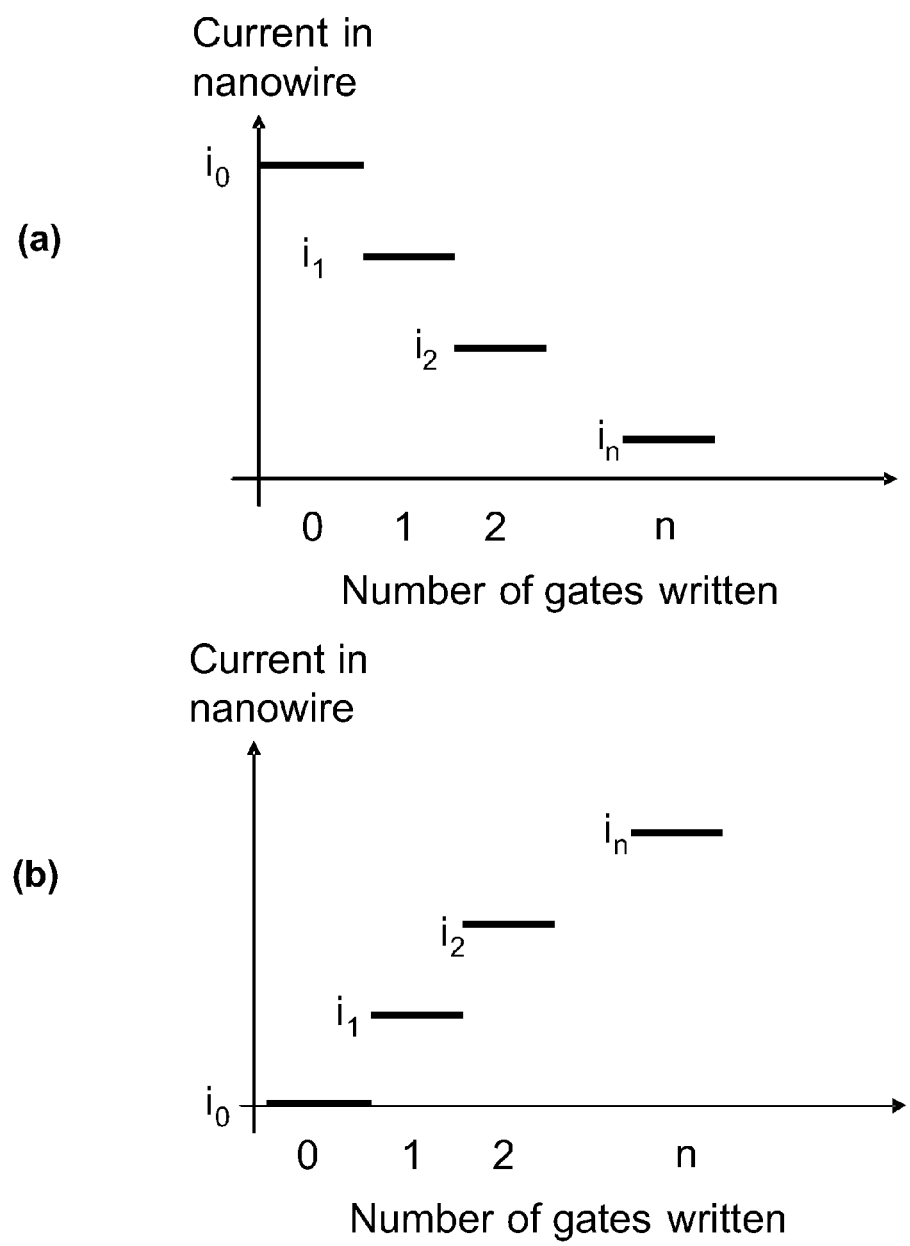

FIGS. 4a-b schematically illustrate operation of a nanostructured memory device according to one embodiment of the present invention comprising a plurality (1 ... n) of gate electrodes 14 arranged around the nanowire 3. Thus the conductivity of the nanowire 3 can be varied step-by-step between multiple conductivity levels. FIG. 4a schematically illustrates operation of the nanostructured memory device in depletion mode and FIG. 4b schematically illustrates operation of the nanostructured memory device in enhancement mode. In depletion mode the current in the nanowire decreases when the number of gate electrodes written increases. In enhancement mode the current in the nanowire increases when the number of gate electrodes written increases.

Figure 5:
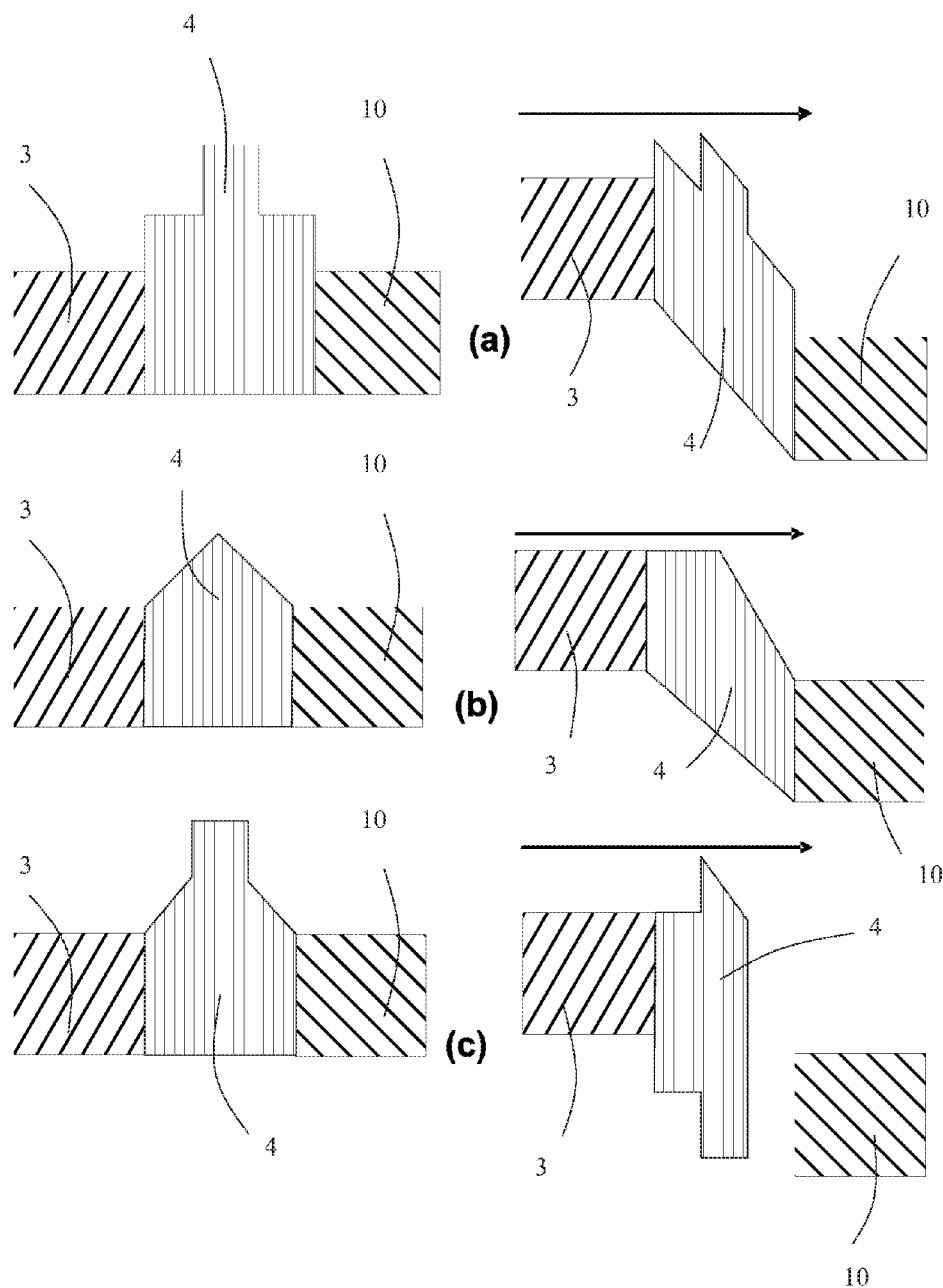

FIGS. 5a-b schematically illustrate three different band gap profiles of the shell layer 4 between the charge trapping centres 10 and the nanowire and the change of the bandgap profile when charging the charge trapping centres 10. In (a) the barrier or shell layer has a double-sided, step-by-step grading, in (b) the grading is double-sided but with a sloping profile, and in (c) the grading of the bandgap profile comprises both a sloped portion and a stepped portion.

The diameter of the nanowires of the nanostructured memory devices according to the present invention is preferably in the range of 3 to 200 nm, more preferably in the range of 3-50 nm, most preferably in the range of 3-20 nm. The thickness of said one or more shell layers 4 is dependent on the diameter of the nanowire 3 and the size of the charge trapping centres. Preferably the distances between the charge trapping centres and the nanowire 3 and the gate electrode 14, respectively, are less than 10 nm, more preferably less than 5 nm. The diameter of each nano-sized trapping centre is preferably less than 20 nm. The length of the nanowires may vary in a wide range. Lengths from about 20 nm and up to several µm are conceivable. From this it is appreciated that the present invention provides a high performance memory device with a foot print smaller than conventional memory devices.

Although the nanowires have been illustrated as having homogenous diameter it is appreciated by a person skilled in the art that the nanowires may be tapered, facetted or otherwise irregularly shaped. The same applies to the charge trapping centres.

Suitable materials for the substrate 12 of the nanostructured memory device include, but is not limited to: Si, GaAs, GaP, GaP:Zn, GaAs, InAs, InP, GaN, $Al_2O_3$, SiC, Ge, GaSb, ZnO, InSb, SOI (silicon-on-insulator), CdS, ZnSe and CdTe. Suitable materials for the nanowires include, but is not limited to IV, III-V, II-VI semiconductors such as: GaAs, InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb and Si or any combination of these. Possible donor dopants are, but not limited to, Si, Sn, Te, Se, S, etc, and acceptor dopants are Zn, Fe, Mg, Be, Cd, etc. Suitable materials for the shell layer in which the charge trapping centres 10 are embedded include the semiconductor materials mentioned above as suitable for the nanowire, although having wider band gap (>2 eV) than the nanowire, and insulators such as $SiO_2$, $HfO_2$ and $Al_2O_3$.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:
1. A nanostructured memory device comprising:
at least one semiconductor nanowire forming a current transport channel;
one or more shell layers arranged around at least a portion of the nanowire;
nano-sized charge trapping centres embedded in said one or more shell layers, wherein a change in an amount of charge stored in one or more of the charge trapping centres alters the conductivity of the nanowire; and
at least a first gate electrode arranged around at least a portion of said one or more shell layers in order to control the amount of charge stored in the charge trapping centres under the gate electrode;

wherein said one or more shell layers are made of materials having different band gap in order to give a graded or crested band profile.

2. The nanostructured memory device according to claim 1, wherein the charge trapping centres are embedded in a wide bandgap semiconductor material or an insulator.

3. The nanostructured memory device according to claim 1, wherein the charge trapping centres are semiconductor nano crystals.

4. The nanostructure memory device according to claim 1, wherein the grading or cresting is one-sided in order to increase write-speed into or out from the charge trapping centres.

5. The nanostructure memory device according to claim 1, wherein the grading or cresting is double-sided in order to increase write-speed into or out from the charge trapping centres.

6. The nanostructure memory device according to claim 1, wherein the grading or crested band profile provides a barrier structure between the charge trapping centres and the nanowire.

7. The nanostructured memory device according to claim 1, wherein the charge trapping centres are semiconductor nano-crystals adapted to be grown by epitaxy, metal nanoparticles deposited from a liquid, gas or vacuum, or a deposited thin film with a plurality of charge traps.

8. The nanostructured memory device according to claim 1, wherein charges are transferred into and out from the charge trapping centres by field-assisted tunnelling.

9. The nanostructured memory device according to claim 1, wherein charges are transferred into and out from the charge trapping centres by charge injection from the nanowire.

10. The nanostructured memory device according to claim 1, wherein the nanowire is adapted to be epitaxially grown from a substrate.

11. The nanostructured memory device according to claim 1, wherein said one or more shell layers are adapted to be epitaxially grown from the nanowire.

12. The nanostructured memory device according to claim 1, wherein the nanowire comprises group IV, group III-V, or group II-VI semiconductor materials, or a combination thereof.

13. The nanostructured memory device according to claim 1, wherein the graded or crested band profile provides a barrier structure between the charge trapping centres and the gate electrode.

14. A nanostructured memory device comprising:
at least one semiconductor nanowire forming a current transport channel;
one or more shell layers arranged around at least a portion of the nanowire;
nano-sized charge trapping centres embedded in said one or more shell layers, wherein a change in an amount of charge stored in one or more of the charge trapping centres alters the conductivity of the nanowire; and
at least a first gate electrode arranged around at least a portion of said one or more shell layers in order to control the amount of charge stored in the charge trapping centres under the gate electrode; and
further comprising a plurality of gate electrodes, each arranged around a respective portion of the nanowire in order to control the amount of charge stored in the charge trapping centres.

15. The nanostructured memory device according to claim 14, wherein the charge trapping centres under each gate electrode are adapted to be charged in groups or separately, whereupon the resistance of the nanowire changes step by step depending on the number of charge trapping centres that are charged by the gate electrodes.

16. The nanostructured memory device according to claim 14, wherein the number of charges transferred by each gate electrode can be controlled.

17. A nanostructured memory device comprising:
at least one semiconductor nanowire forming a current transport channel;
one or more shell layers arranged around at least a portion of the nanowire;
nano-sized charge trapping centres embedded in said one or more shell layers, wherein a change in an amount of charge stored in one or more of the charge trapping centres alters the conductivity of the nanowire; and
at least a first gate electrode arranged around at least a portion of said one or more shell layers in order to control the amount of charge stored in the charge trapping centres under the gate electrode; and
further comprising a group of nanowires connected in parallel in each end portion of the nanowires, wherein the nanowires are individually gated by one or more gate electrodes and each nanowire contributes to one or more levels of a read current.

* * * * *